United States Patent
Hwang et al.

(10) Patent No.: US 11,784,647 B2
(45) Date of Patent: Oct. 10, 2023

(54) CIRCUIT PERFORMING LOGICAL OPERATION AND FLIP-FLOP INCLUDING THE CIRCUIT

(71) Applicant: SAMSUNG ELECTRONICS CO., LTD., Suwon-si (KR)

(72) Inventors: Hyunchul Hwang, Suwon-si (KR); Minsu Kim, Hwaseong-si (KR); Janghwan Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/503,791

(22) Filed: Oct. 18, 2021

(65) Prior Publication Data
US 2022/0158640 A1 May 19, 2022

(30) Foreign Application Priority Data

Oct. 30, 2020 (KR) .................. 10-2020-0143870
Mar. 15, 2021 (KR) .................. 10-2021-0033592

(51) Int. Cl.
*H03K 19/096* (2006.01)
*H03K 19/20* (2006.01)

(52) U.S. Cl.
CPC ......... *H03K 19/0963* (2013.01); *H03K 19/20* (2013.01)

(58) Field of Classification Search
None
See application file for complete search history.

(56) References Cited

U.S. PATENT DOCUMENTS

| | | |
|---|---|---|
| 6,459,316 B1 | 10/2002 | Vangal et al. |
| 6,597,223 B2 | 7/2003 | Vangal et al. |
| 6,701,339 B2 | 3/2004 | Vangal et al. |
| 7,319,344 B2 | 1/2008 | Klass |
| 7,336,105 B2 | 2/2008 | Chuang et al. |
| 9,124,261 B2 | 9/2015 | Kim |
| 9,438,213 B2 | 9/2016 | Elkin et al. |
| 10,177,765 B2 | 1/2019 | Hsu et al. |
| 10,659,015 B2 | 5/2020 | Liles et al. |
| 2008/0116938 A1 | 5/2008 | Ngo et al. |
| 2011/0016367 A1 | 1/2011 | Tang et al. |
| 2017/0324413 A1* | 11/2017 | Hwang .................. H03K 3/012 |

* cited by examiner

*Primary Examiner* — Jany Richardson
(74) *Attorney, Agent, or Firm* — F. Chau & Associates, LLC

(57) ABSTRACT

An integrated circuit includes a first circuit, a second circuit, and an inverter. The first circuit receives a first input signal, an inverted clock signal, a first logic level of a first output node, and a logic level of a second output node to determine a second logic level of a first output node. The second circuit receives the first input signal, the clock signal, the first logic level, and the second logic level to determine a logic level of the second output node. The inverter receives a second input signal to output the inverted second input signal to the first circuit or the second circuit. A logic level of the first output node or a logic level of the second output node is output as an output signal when a logic level of the clock signal is a first logic level.

20 Claims, 16 Drawing Sheets

Y = !NET1 or !NET2 = A·B

CIRCUIT PERFORMING LOGICAL OPERATION AND FLIP-FLOP INCLUDING THE CIRCUIT

CROSS-REFERENCE TO RELATED APPLICATIONS

This non-provisional U.S. patent application claims priority under 35 U.S.C. § 119 to Korean Patent Application Nos. 10-2020-0143870, filed on Oct. 30, 2020, and 10-2021-0033592, filed on Mar. 15, 2021, in the Korean Intellectual Property Office, the disclosures of which are incorporated by reference in their entireties herein.

1. Technical Field

The inventive concept relates to a circuit for performing a logical operation, and more particularly, to a flip-flop including the circuit.

2. Discussion of Related Art

An integrated circuit (IC) is a set of electronic circuits disposed on a piece of semiconductor material. The integrated circuit may include a plurality of active devices (e.g., transistors and diodes) and passive devices (e.g., capacitors and resistors).

The integrated circuit may include a plurality of sequential circuits formed from the active and passive devices. The sequential circuits may refer to circuits outputting output data based on input data and previously stored data. The sequential circuits may include, for example, latches, flip-flops (FF), or integrated clock gating (IGC) cells. An output from a sequential circuit may be input to a combinational logic circuit for performing a function, and an output from the combinational logic circuit may be input to another sequential circuit.

As ICs become more sophisticated, the amount of logical operations performed by a combinational logic circuit increases. However, a delay time for an output from a sequential circuit to the combinational logic circuit and a delay time for an output from the combinational logic circuit to a next sequential circuit increases when the amount of performed logical operations increases.

SUMMARY

At least one embodiment of the inventive concept relates to a dynamic sequential circuit for performing a logical operation, and more particularly, to a logic embedded latch circuit and a flip-flop including the logic embedded latch circuit.

According to an embodiment of the inventive concept, there is provided an integrated circuit configured to perform a logical operation on a plurality of input signals including a first input signal and a second input signal to generate an output signal. The integrated circuit includes a first circuit, a second circuit, and an inverter. The first circuit is configured to receive a logic level of the first input signal, an inverted logic level of a clock signal, a logic level of a first output node, and a logic level of a second output node to determine a logic level of an output node. The second circuit configured to receive the logic level of the first input signal, a logic level of the clock signal, the logic level of the first output node, and the logic level of the second output node to determine the logic level of the second output node. The inverter is configured to invert a second input signal and output the inverted second input signal to the first circuit or the second circuit. The logic level of the first output node or the logic level of the second output node is output as an output signal when the logic level of the clock signal is a first logic level.

According to an embodiment of the inventive concept, there is provided a logic embedded dynamic sequential circuit including a first logic circuit, a second logic circuit, a first inverting circuit, and a second inverting circuit. The first logic circuit is configured to determine a logic level of a first output node based on a result of performing a first logical operation on first input signals. The second logic circuit is configured to determine a logic level of a second output node based on the result of performing the first logical operation on the first input signals. The first inverting circuit is configured to determine a logic level of a first node based on a result of performing a third logical operation on third input signals. The second inverting circuit is configured to determine a logic level of a second node based on a result of performing a second logical operation on second input signals. The logic level of the first output node or the second output node is determined by performing an OR operation on the result of performing the first logical operation and the result of the performing the second logical operation to generate a first result, and performing an AND operation on the first result and the result of performing the third logical operation.

According to an embodiment of the inventive concept, there is provided an integrated circuit to perform a logical operation. The integrated circuit includes a first circuit, a second circuit, and an inverter. The first circuit us configured to determine a logic level of a first output node based on a first input signal, a second input signal, an inverted clock signal, a logic level of a first output node, and a logic level of a second output node. The second circuit is configured to determine the logic level of the first output node based on the first input signal, the second input signal, the logic level of the first output node, the logic level of the second output node, and an inverted logic level of a logic level of a third input signal. The inverter is configured to invert the logic level of the third input signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, various embodiments of the inventive concept will be described with reference to the accompanying drawings.

Figure 1:
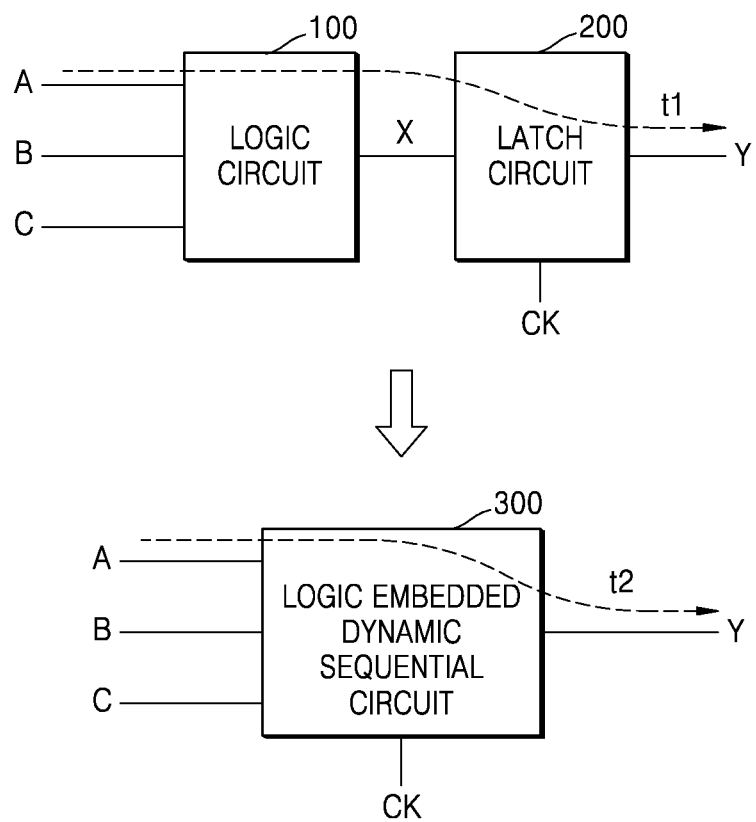
FIG. 1 is a block diagram illustrating an integrated circuit (IC) according to an example embodiment of the present disclosure.

FIG. 1 is a block diagram illustrating an integrated circuit (IC) according to an example embodiment of the present disclosure. In an embodiment, an upper portion of FIG. 1 is a block diagram illustrating an IC including a logic circuit 100 and a latch circuit 200, and a lower portion of FIG. 1 is a block diagram illustrating an IC including a logic embedded dynamic sequential circuit 300.

The logic circuit 100 may receive a plurality of input signals A, B, and C, and outputs a signal X based on the input signals A, B, and C. In FIG. 1, the logic circuit 100 is illustrated as receiving three input signals, but the number of input signals received by the logic circuit 100 is not limited thereto. The logic circuit 100 may generate the signal X by performing a logical operation on the input signals A, B, and C. The logical operation may be one of an AND operation, a NAND operation, an OR operation, a NOR operation, an XOR operation, or a combination thereof, but the inventive concept is not limited thereto.

The latch circuit 200 may receive the signal X and outputs a signal Y according to a clock signal CK. If the clock signal CK has a certain logic level, the latch circuit 200 may operate in a level-triggered manner of generating the signal Y based on a logic level of the signal X. That is, the latch circuit 200 may receive the signal X which is a result of performing the logical operation on the input signals A, B, and C, and output the signal Y according to the clock signal CK. A time taken for the logic circuit 100 to receive the input signals A, B, and C and for the latch circuit 200 to output the signal Y may be a first time t1.

The logic embedded dynamic sequential circuit 300 may receive the input signals A, B, and C and outputs the signal Y based on the input signals A, B, and C. The logic embedded dynamic sequential circuit 300 may output a result of performing the logical operation on the input signals A, B, and C, as the signal Y according to the clock signal CK. A time taken for the logic embedded dynamic sequential circuit 300 to receive the input signals A, B, and C and output the signal Y may be a second time t2. In the logic embedded dynamic sequential circuit 300, a circuit structure performing a logical operation function and a circuit structure performing a latching function may be partially shared. Accordingly, a size of the logic embedded dynamic sequential circuit 300 may be smaller than the sum of a size of the logic circuit 100 and a size of the latch circuit 200. Also, a length of the second time t2 may be shorter than a length of the first time t1. An IC including the logic embedded dynamic sequential circuit 300 according to an example embodiment of the present disclosure may have an improved data processing speed.

Figure 2:
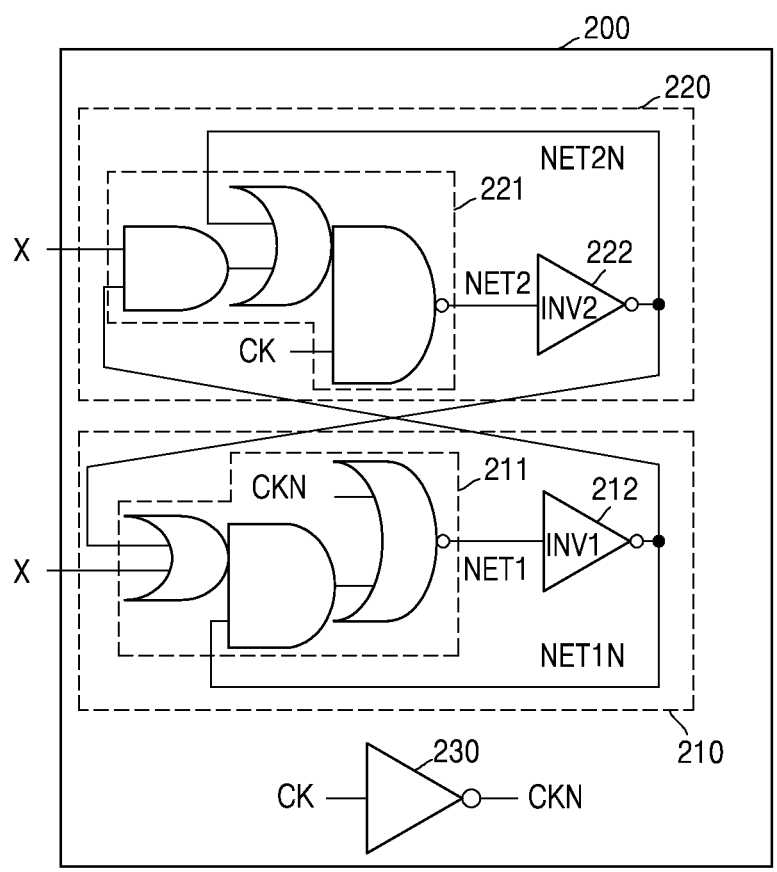
FIG. 2 is a circuit diagram illustrating a gate-level latch circuit according to an example embodiment of the present disclosure.

FIG. 2 is a circuit diagram illustrating a gate-level latch circuit 200 according to an example embodiment of the present disclosure. Referring to FIG. 2, the latch circuit 200 may receive the input signal X and outputs the signal Y according to the clock signal CK. The latch circuit 200 may include a first circuit 210, a second circuit 220, and a clock inverter 230 (e.g., an inverter circuit). A logic level of the signal Y may be a logic level obtained by inverting a logic level of a first output node NET1 or a logic level of a second output node NET2. The inverted logic level of the first output node NET1 may be referred to as !NET1 and the inverted logic level of the second output node NET may be referred to as !NET2. In an embodiment, the signal Y may have the same logic level as a first node NET1N or a second node NET2N.

In an embodiment, the first circuit 210 may receive a logic level of the input signal X, the logic level of the second node NET2N, a logic level of an inverted clock signal CKN, and the logic level of the first node NET1N, to determine the logic level of the first output node NET1. Referring to FIG. 2, the logic level of the second node NET2N may be an inverted logic level of the logic level of the second output node NET2. The logic level of the first node NET1N may be an inverted logic level of the logic level of the first output node NET1.

In an embodiment, the second circuit 220 receives the logic level of the input signal X, the logic level of the second node NET2N, the logic level of the clock signal CK, and the logic level of the first node NET1N, to determine the logic level of the output node NET2.

The first circuit 210 may include a first operation unit 211 (e.g., first logic circuit) and a first inverting circuit 212. The first operation unit 211 may receive the input signal X and determines the logic level of the first output node NET1 according to the inverted clock signal CKN. As shown in FIG. 2, the first operation unit 211 may have a structure in which a 2-input OR gate, a 2-input AND gate, and a 2-input NOR gate are connected. The first inverting circuit 212 may operate as an inverter that generates the inverted logic level of the logic level of the first output node NET1, as the logic level of the first node NET1N.

The second circuit 220 may include a second operation unit 221 (e.g., a second logic circuit) and a second inverting circuit 222. The second operation unit 221 may receive the input signal X and determines the logic level of the second output node NET2 according to the clock signal CK. As shown in FIG. 2, the second operation unit 221 may have a structure in which a 2-input AND gate, a 2-input OR gate, and a 2-input NAND gate are connected. The second inverting circuit 222 may operate as an inverter that generates the inverted logic level of the logic level of the second output node NET2, as the logic level of the second node NET2N.

Figure 3:
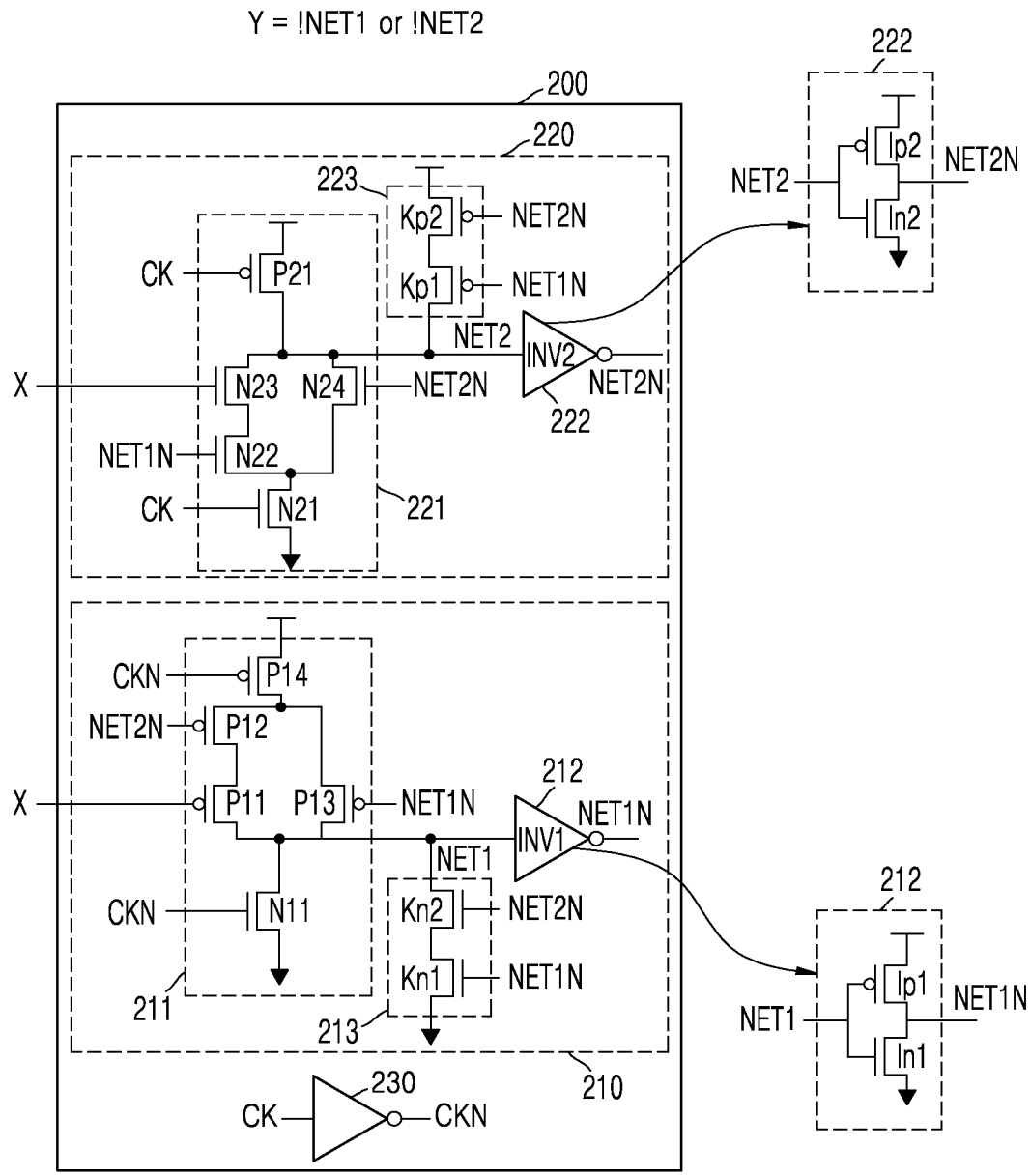
FIG. 3 is a circuit diagram illustrating a transistor-level latch circuit according to an example embodiment of the present disclosure.

FIG. 3 is a circuit diagram illustrating a transistor-level latch circuit 200 according to an example embodiment of the present disclosure. Referring to FIG. 3, the latch circuit 200 may receive the input signal X and outputs the signal Y according to the clock signal CK. The latch circuit 200 may include the first circuit 210, the second circuit 220, and the clock inverter 230. Descriptions overlapping with those described above with reference to FIG. 2 may be omitted. Referring to FIG. 3, an inverted logic level of at least one of the logic level of the first output node NET1 and the logic level of the second output node NET2 may be output as the logic level of the signal Y.

The first circuit 210 may include the first operation unit 211, the first inverting circuit 212, and a discharge circuit 213.

The first operation unit 211 may include an N-type transistor N11 and a plurality of P-type transistors P11 to P14.

The N-type transistor N11 may receive the inverted clock signal CKN at a gate terminal thereof, a source terminal thereof may be connected to a ground node, and a drain terminal thereof may be connected to the first output node NET1. When the logic level of the inverted clock signal CKN is a logic high level, that is, when the logic level of the clock signal CK is a logic low level, the N-type transistor N11 may discharge the first output node NET1 so that the logic level of the first output node NET1 is a logic low level.

The P-type transistors P11 to P14 may determine the logic level of the first output node NET1 according to the input signal X when the logic level of the inverted clock signal CKN is the logic low level.

The discharge circuit 213 may discharge the first output node NET1 so that the logic level of the first output node NET1 is maintained at the logic low level. For example, the discharge circuit 213 may include an N-type transistor Kn1 receiving the logic level of the first node NET1N at a gate terminal thereof and an N-type transistor Kn2 receiving the logic level of the second node NET2N at a gate terminal thereof. When the logic level of the first node NET1N and the logic level of the second node NET2N are the logic high levels, the discharge circuit 213 may discharge the first output node NET1 to maintain the first output node NET1 at the logic low level. When the first output node NET1 is maintained at the logic low level, the first node NET1N may be maintained at the logic high level, and thus, a stable output signal may be output.

The first inverting circuit 212 may include an N-type transistor In1 and a P-type transistor Ip1 operating as an inverter.

The second circuit 220 may include the second operation unit 221, the second inverting circuit 222, and a precharge circuit 223.

The second operation unit 221 may include a plurality of N-type transistors N21 to N24 and a P-type transistor P21.

The N-type transistors N21 to N24 may determine the logic level of the second output node NET2 according to the input signal X when the logic level of the clock signal CK is the logic high level.

The P-type transistor P21 may receive the clock signal CK at a gate terminal thereof, a source terminal thereof may be connected to a supply power node, and a drain terminal thereof may be connected to the second output node NET2.

When the logic level of the clock signal CK is the logic low level, the P-type transistor P21 may precharge the second output node NET2 so that the logic level of the second output node NET2 is the logic high level.

The precharge circuit 223 may precharge the second output node NET2 so that the second output node NET2 is maintained at the logic high level. For example, the precharge circuit 223 may include a P-type transistor Kp1 receiving the logic level of the first node NET1N at a gate terminal thereof and a P-type transistor Kp2 receiving the logic level of the second node NET2N at a gate terminal thereof. When the logic level of the first node NET1N and the logic level of the second node NET2N are the logic low levels, the precharge circuit 223 may precharge the second output node NET2 to maintain the second output node NET2 at the logic high level. When the second output node NET2 is maintained at the logic high level, the second node NET2N is maintained at the logic low level, and thus, a stable output signal may be output.

The second inverting circuit 222 may include an N-type transistor In2 and a P-type transistor Ip2 operating as an inverter.

Figure 4:
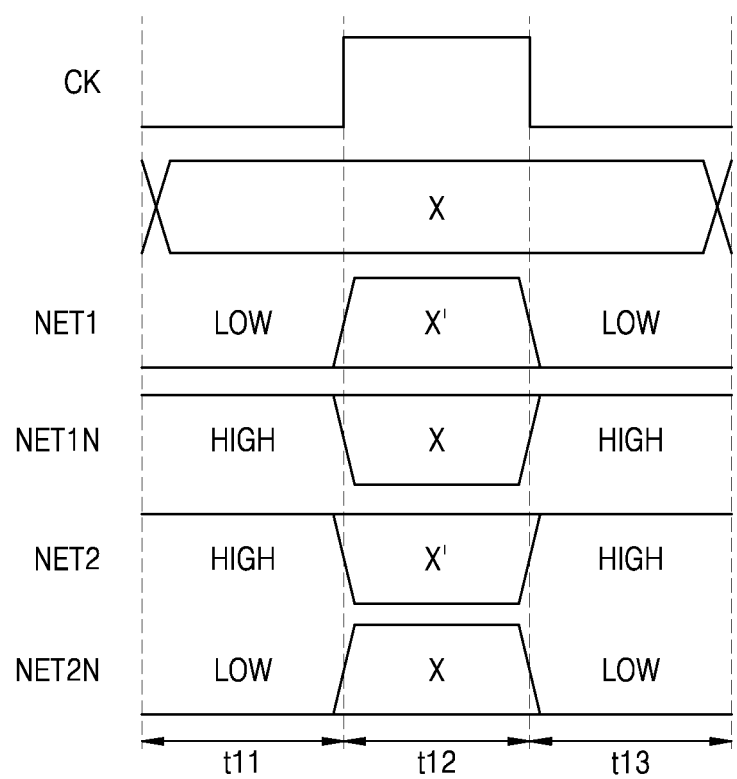
FIG. 4 is a timing diagram illustrating an operation of a latch circuit according to an example embodiment of the present disclosure.

FIG. 4 is a timing diagram illustrating an operation of the latch circuit 200 according to an example embodiment of the present disclosure. FIG. 4 is a timing diagram illustrating an operation of the latch circuit 200 of FIGS. 2 and 3. Referring to FIG. 4, the clock signal CK may maintain the logic low level for a first time period t11, maintains the logic high level for a second time period t12 subsequent to the first time period t11, and maintains the logic low level for a third time period t13 subsequent to the second time period t12. For example, the clock signal CK may toggle to the high logic level after time t11 and toggle to the logic low level after time t12.

When the clock signal CK is at the logic low level, that is, when the inverted clock signal CKN is at the logic high level in the first time period t11 or the third time period t13, the first output node NET1 may be maintained at the logic low level by the N-type transistor N11. When the logic level of the first output node NET1 is the logic low level, the logic level of the first node NET1N may become the logic high level by the first inverting circuit 212.

When the clock signal CK is at the logic low level in the first time period t11 or the third time period t13, the second output node NET2 may be maintained at the logic high level by the P-type transistor P21. When the logic level of the second output node NET2 is the logic low level, the logic level of the second node NET2N may become the logic low level by the second inverting circuit 222.

When the clock signal CK is at the logic high level in the second time period t12, the first operation unit 211 may generate the logic level of the first output node NET1 by inverting the logic level of the input signal X. That is, the logic level of the first output node NET1 may be the logic level of an inverted input signal X'. Because the first inverting circuit 212 determines the logic level of the first node NET1N by inverting the logic level of the first output node NET1, the logic level of the first node NET1N may be the logic level of the input signal X. When the clock signal CK has the logic high level, the second operation unit 221 may generate the logic level of the second output node NET2 by inverting the logic level of the input signal X. That is, the logic level of the second output node NET2 may become the logic level of the inverted input signal X'. Because the second inverting circuit 222 determines the logic level of the second node NET2N by inverting the logic level of the second output node NET2, the logic level of the second node NET2N may become the logic level of the input signal X. Accordingly, the latch circuit 200 may operate as a latch circuit latching the input signal X when the logic level of the clock signal CK is the logic high level.

Figure 5:
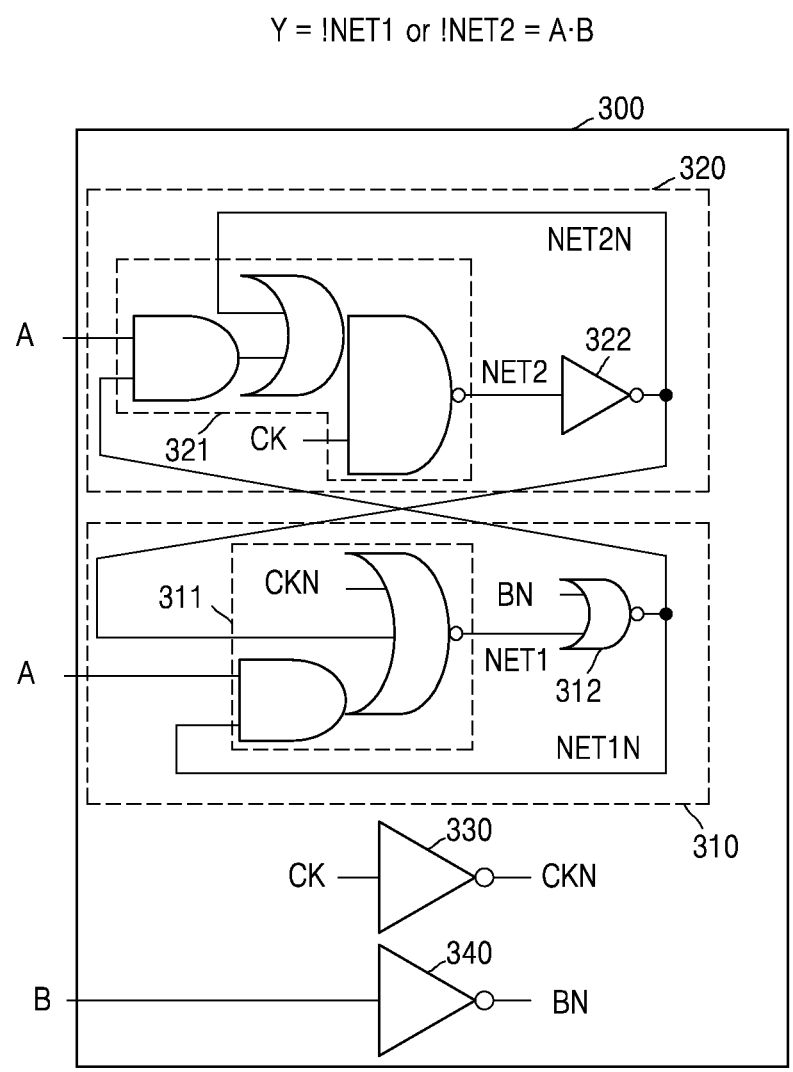
FIG. 5 is a circuit diagram illustrating a gate-level logic embedded dynamic sequential circuit according to an example embodiment of the present disclosure.

FIG. 5 is a circuit diagram illustrating a gate-level logic embedded dynamic sequential circuit 300 according to an example embodiment of the present disclosure. FIG. 5 is a circuit diagram illustrating the logic embedded dynamic sequential circuit 300 receiving a plurality of input signals A and B and outputting A·B, which is a result of performing an AND operation on the input signal A and the input signal B, as a signal Y according to the clock signal CK, at a logic gate circuit level. A logic level of the signal Y may be the same as the logic level obtained by inverting the logic level of the first output node NET1 or the second output node NET2. In an embodiment, the logic level of the signal Y may be the same as the logic level of A·B in a time period in which the clock signal CK has the first logic level (e.g., the logic high level). The logic embedded dynamic sequential circuit 300 may include a first circuit 310, a second circuit 320, a clock inverter 330, and an inverter 340.

The first circuit 310 may include a first operation unit 311 and a first inverting circuit 312. The first operation unit 311 may determine the logic level of the first output node NET1 based on the logic level of the input signal A, the logic level of the inverted clock signal CKN, the logic level of the first node NET1N, and the logic level of the second node NET2N. In an embodiment, the first operation unit 311 may include an AND gate performing an AND operation on the logic level of the input signal A and the logic level of the first node NET1N and a NOR gate performing a NOR operation based on an output signal from the AND gate, the logic level of the second node NET2N, and the logic level of the inverted clock signal CKN. The first inverting circuit 312 may determine the logic level of the first node NET1N based on the logic level of the first output node NET1 and a logic level of an inverted input signal BN. In an embodiment, the first inverting circuit 312 may be a NOR gate performing a NOR operation on the logic level of the first output node NET1 and the logic level of the inverted input signal BN.

The second circuit 320 includes a second operation unit 321 and a second inverting circuit 322. The second operation unit 321 may determine the logic level of the second output node NET2 based on the logic level of the input signal A, the logic level of the clock signal CK, the logic level of the first node NET1N, and the logic level of the second node NET2N. In an embodiment, the second operation unit 321 may include an AND gate performing an AND operation on the logic level of the input signal A and the logic level of the first node NET1N, an OR gate performing an OR operation on an output signal from the AND gate and the logic level of the second node NET2N, and a NAND gate performing a NAND operation based on an output signal from the OR gate and the logic level of the clock signal CK. The second inverting circuit 322 may determine the logic level of the second node NET2N based on the logic level of the second output node NET2. In an embodiment, the second inverting circuit 322 may be an inverter inverting the logic level of the second output node NET2.

The clock inverter 330 may receive the clock signal CK and invert the logic level of the clock signal CK to generate the inverted clock signal CKN.

The inverter 340 may receive the input signal B and invert a logic level of the input signal B to generate the inverted input signal BN.

As will be described later with reference to FIGS. 6 and 7, the logic embedded dynamic sequential circuit 300 of FIG. 5 may output a result of performing the AND operation on the input signals A and B according to the clock signal CK. For example, the logic embedded dynamic sequential circuit 300 may output the result of performing the AND operation on the input signals A and B, as the signal Y, when the logic level of the clock signal CK is the logic high level. That is, because both the logical operation performed on the input signals to generate a result and latching on the result of the logical operation may be performed through one IC, a size of the IC may be reduced and an operation rate of the IC may be improved.

Figure 6:
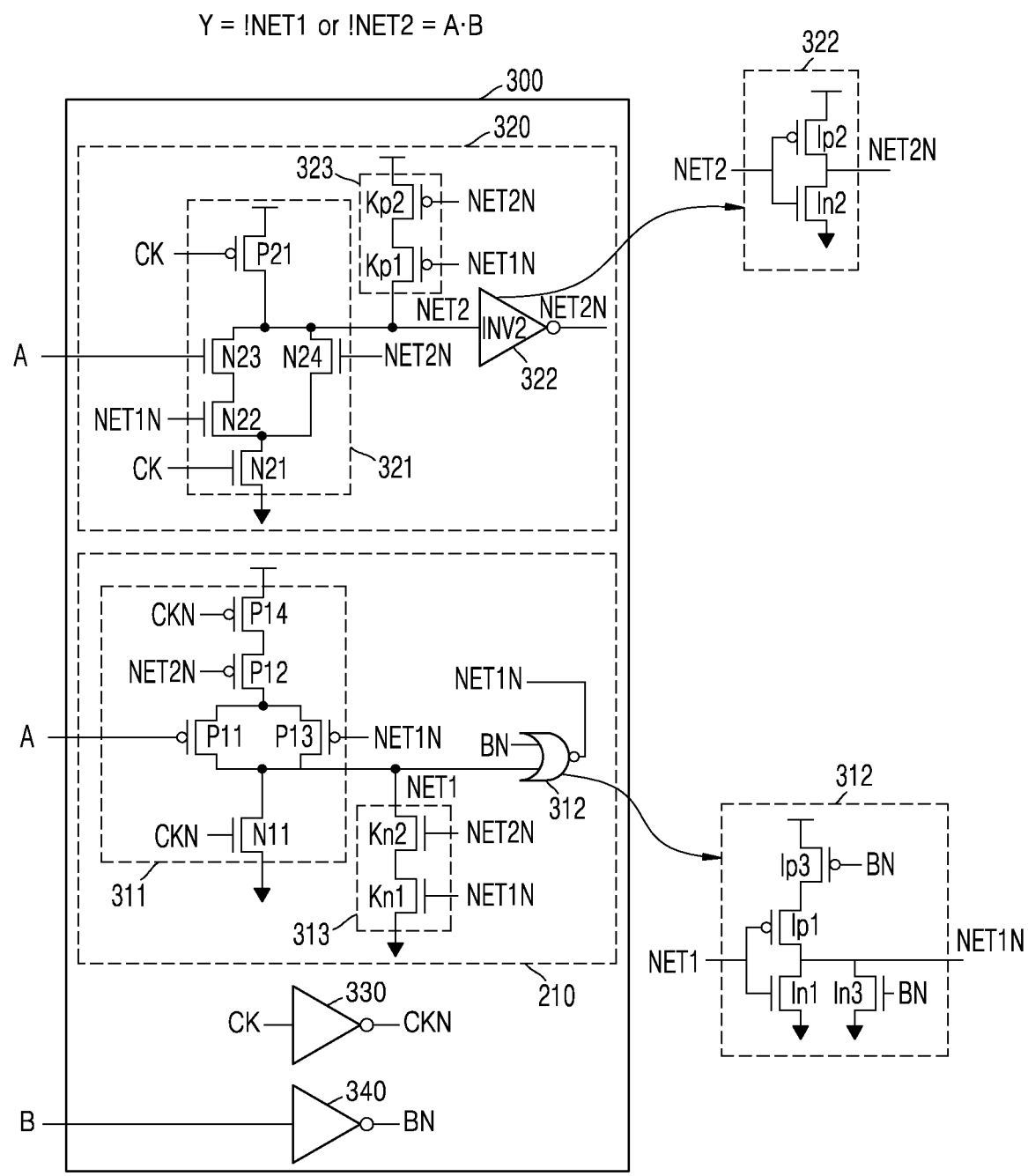
FIG. 6 is a circuit diagram illustrating a transistor-level logic embedded dynamic sequential circuit according to an example embodiment of the present disclosure.

FIG. 6 is a circuit diagram illustrating a transistor-level logic embedded dynamic sequential circuit 300 according to an example embodiment of the present disclosure. FIG. 7 is a timing diagram illustrating an operation of the logic embedded dynamic sequential circuit 300 according to an example embodiment of the present disclosure. FIG. 6 is a circuit diagram illustrating the logic embedded dynamic sequential circuit 300 of FIG. 5 at a transistor level, and FIG. 7 is a timing diagram illustrating the operation of the logic embedded dynamic sequential circuit 300 of FIG. 5.

Referring to FIG. 6, the logic embedded dynamic sequential circuit 300 includes the first operation unit 311 and the first inverting circuit 312. Unlike the first operation unit 211 of FIG. 3, when the logic level of the inverted clock signal CKN is the logic low level, the first operation unit 311 of FIG. 6 may perform the AND operation on the logic level of the input signal A and the logic level of the first node NET1N to determine the logic level of the first output node NET1 based on a result of an NOR operation performed on the logic level of the second node NET2N and a result of the AND operation. The logic level of the signal Y may be the same as a logic level obtained by inverting the logic level of the first output node NET1 or the second output node NET2.

Unlike the first inverting circuit 212 of FIG. 3, the first inverting circuit 312 of FIG. 6 may include an N-type transistor In3 connected to the N-type transistor In1 in parallel and receiving the inverted input signal BN at a gate terminal thereof. In addition, the first inverting circuit 312 of FIG. 6 may include a P-type transistor Ip3 connected in series to the P-type transistor Ip1 and receiving the inverted input signal BN at a gate terminal thereof. As a result, the first inverting circuit 312 of FIG. 6 may determine the logic level of the first node NET1N by performing an NOR operation on the logic level of the first output node NET1 and the logic level of the inverted input signal BN.

Figure 7:
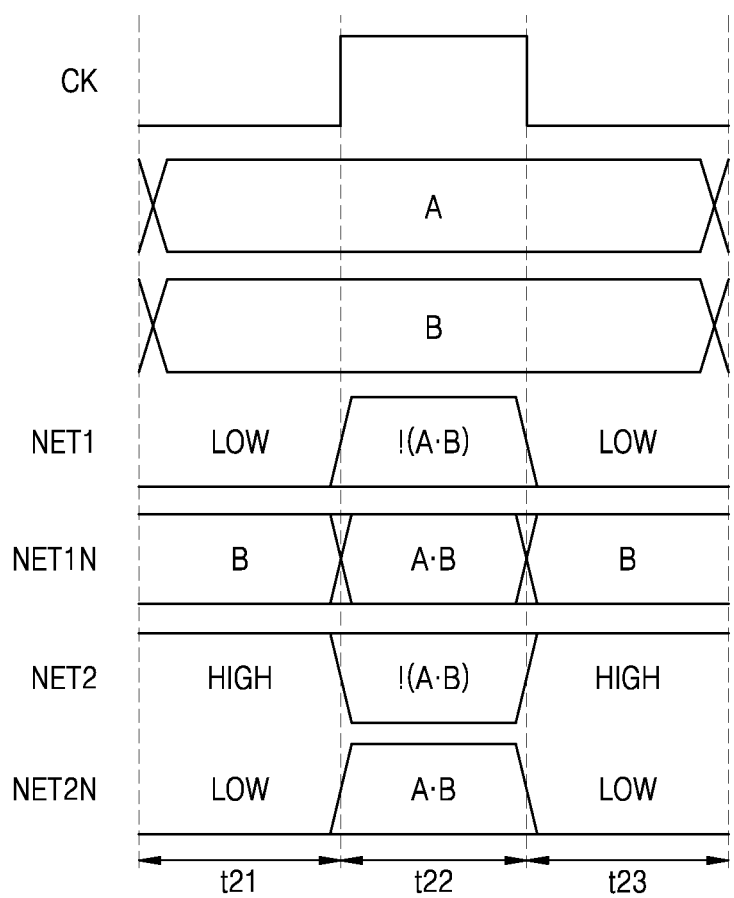
FIG. 7 is a timing diagram illustrating an operation of a logic embedded dynamic sequential circuit according to an example embodiment of the present disclosure.

Referring to FIG. 7, when the clock signal CK is at the logic low level in a first time period t21 or a third time period t23, that is, when the inverted clock signal CKN has the logic high level, the first output node NET1 may be maintained at the logic low level by the N-type transistor N11. When the logic level of the first output node NET1 is the logic low level, the first inverting circuit 312 may perform an NOR operation on the logic level of the first output node NET1 and the inverted input signal BN to determine the logic level of the input signal B as the logic level of the first node NET1N.

When the clock signal CK has the logic low level in the first time period t21 or the third time period t23, the second output node NET2 may be maintained at the logic high level by the P-type transistor P21. When the logic level of the second output node NET2 is the logic high level, the logic level of the second node NET2N may become the logic low level by the second inverting circuit 322.

When the clock signal CK has the logic high level, that is, when the inverted clock signal CKN has the logic low level in a second time period t22, the first operation unit 311 may determine the logic level of the first output node NET1 based on the logic level of the input signal A and the logic level of the first node NET1N (i.e., the logic level of the input signal B). For example, the logic level of the first output node NET1 may be determined by a !A·B operation. The !A·B operation may refer to a NAND operation performed on A and B. Because the first operation unit 311 performs the NAND operation using only the P-type transistors P11 to P14, a size of the IC may be reduced. The first inverting circuit 312 may determine the logic level of the first node NET1N based on a NOR operation performed on the logic level of the first node NET1 and the logic level of the inverted input signal BN. For example, the logic level of the first node NET1N may be determined by an A·B operation. Similarly to the first operation unit 311, the second operation unit 321 may determine the logic level of the second output node NET2 based on the AND operation on the logic level of the input signal A and the logic level of the first node NET1N (i.e., the logic level of the input signal B). For example, the logic level of the second output node NET2 may be determined by a !A·B operation. Because the second operation unit 321 performs the NAND operation using only the N-type transistors N21 to N24, a size of the IC may be reduced.

The logic embedded dynamic sequential circuit 300 may include a discharge circuit 313 and a precharge circuit 323.

Referring to FIG. 7, when both the logic level of the first node NET1N and the logic level of the second node NET2N are the logic high levels (e.g., when A·B has the logic level in the second time period t22), the logic level of the first output node NET1 may be the logic low level. When the logic level of the first node NET1N and the logic level of the second node NET2N are the logic high levels, the discharge circuit 313 may discharge the first output node NET1 to maintain the first output node NET1 at the logic low level. Accordingly, because a stable logic level may be maintained in the nodes through the discharge circuit 313, reliability of the IC including the logic-embedded dynamic sequential circuit 300 may be improved.

Referring to FIG. 7, when both the logic level of the first node NET1N and the logic level of the second node NET2N are the logic low levels (e.g., when the input signal B has the logic low level in the first time period t21), the logic level of the second output node NET2 may become the logic high level. When both the logic level of the first node NET1N and the logic level of the second node NET2N are the logic low levels, the precharge circuit 323 may precharge the second output node NET2 to maintain the second output node NET2 at the logic high level. Accordingly, because a stable logic level may be maintained in the nodes through the precharge circuit 323, reliability of the IC including the logic embedded dynamic sequential circuit 300 may be improved.

The logic embedded dynamic sequential circuit 300 according to an example embodiment of the present disclosure may maintain the logic level of the first node NET1N at the logic level of the input signal B when the clock signal CK has the logic low level through the first inverting circuit 312. As a result, the logic embedded dynamic sequential circuit 300 may determine the logic level of the output signal based on the AND operation performed on the input signal A and the input signal B when the clock signal CK has the logic high level. Thus, the logical operation and the latching operation may be performed within one cycle and an operation rate of the IC may be improved.

Figure 8:
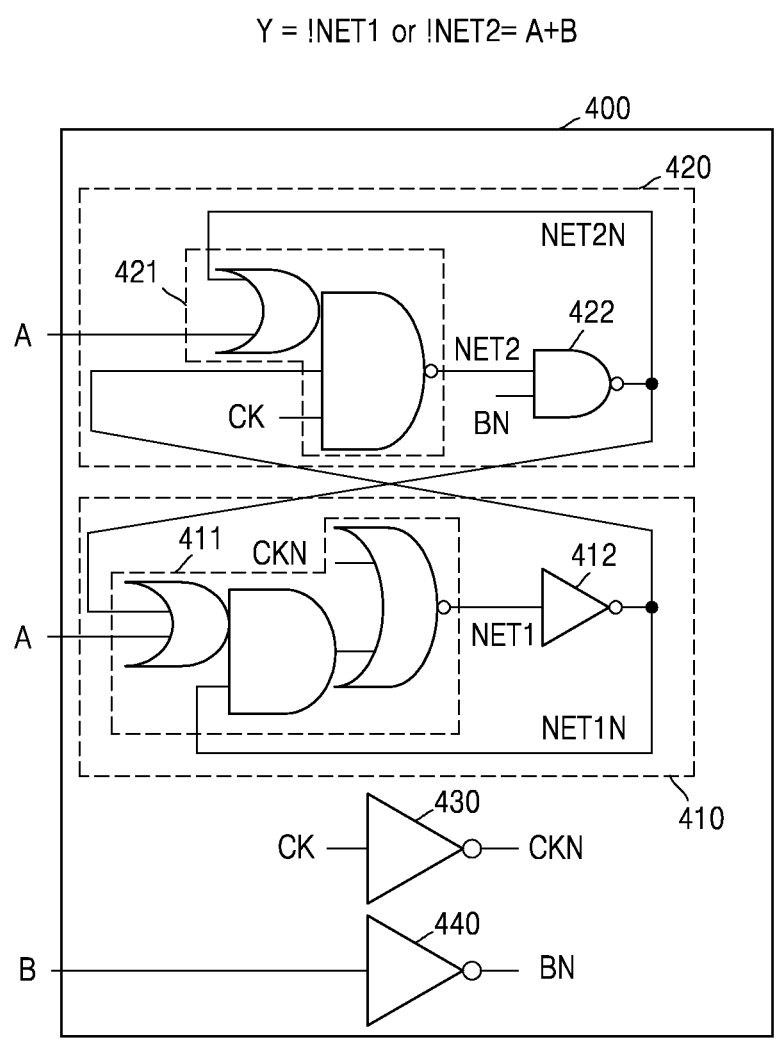
FIG. 8 is a circuit diagram illustrating a gate-level logic embedded dynamic sequential circuit according to an example embodiment of the present disclosure.

FIG. 8 is a circuit diagram illustrating a gate-level logic embedded dynamic sequential circuit 400 according to an example embodiment of the present disclosure. FIG. 8 is a circuit diagram illustrating the logic embedded dynamic sequential circuit 400 receiving the input signals A and B and outputting A+B, which is a result of performing an OR operation on the input signal A and the input signal B, as the signal Y according to the clock signal CK, at a gate level. The logic level of the signal Y may be the same as the logic level obtained by inverting the logic level of the first output node NET1 or the second output node NET2. The logic embedded dynamic sequential circuit 400 may include a first circuit 410, a second circuit 420, a clock inverter 430, and an inverter 440.

The first circuit 410 may include a first operation unit 411 and a first inverting circuit 412. The first operation unit 411 may determine the logic level of the first output node NET1 based on the logic level of the input signal A, the logic level of the inverted clock signal CKN, the logic level of the first node NET1N, and the logic level of the second node NET2N. In an embodiment, the first operation unit 411 may include an OR gate performing an OR operation on the logic level of the input signal A and the logic level of the second node NET2N, an AND gate performing an AND operation on an output signal from the OR gate and the logic level of the first node NET1N, and a NOR gate performing a NOR operation based on an output signal from the AND gate and the logic level of the inverted clock signal CKN. The first inverting circuit 412 may determine the logic level of the first node NET1N based on the logic level of the first output node NET1. In an embodiment, the first inverting circuit 412 may be an inverter inverting the logic level of the first output node NET1.

The second circuit 420 may include a second operation unit 421 and a second inverting circuit 422. The second operation unit 421 may determine the logic level of the second output node NET2 based on the logic level of the input signal A, the logic level of the second node NET2N, and the logic level of the clock signal CK. In an embodiment, the second operation unit 421 may include an OR gate performing an OR operation on the logic level of the input signal A and the logic level of the second node NET2N and a NAND gate performing a NAND operation on an output signal from the OR gate, the logic level of the first node NET1N, and the logic level of the clock signal CK. The second inverting circuit 422 may determine the logic level of the second node NET2N based on the logic level of the second output node NET2 and the logic level of the inverted input signal BN. In an embodiment, the second inverting circuit 422 may be a NAND gate performing a NAND operation on the logic level of the second output node NET2.

The clock inverter 430 may receive the clock signal CK and invert the logic level of the clock signal CK to generate the inverted clock signal CKN.

The inverter 440 may receive the input signal B and invert the logic level of the input signal B to generate the inverted input signal BN.

As will be described later with reference to FIGS. 9 and 10, the logic embedded dynamic sequential circuit 400 of FIG. 8 may output a result of performing an OR operation on the input signals A and B according to the clock signal CK. For example, the logic embedded dynamic sequential circuit 400 may output the result of performing the OR operation on the input signals A and B, as the signal Y, when the logic level of the clock signal CK is the logic high level. That is, because both the logical operation performed on the input signals and the latching performed on the result of the logical operation may be performed through one IC, a size of the IC may be reduced and the operation rate of the IC may be improved.

Figure 9:
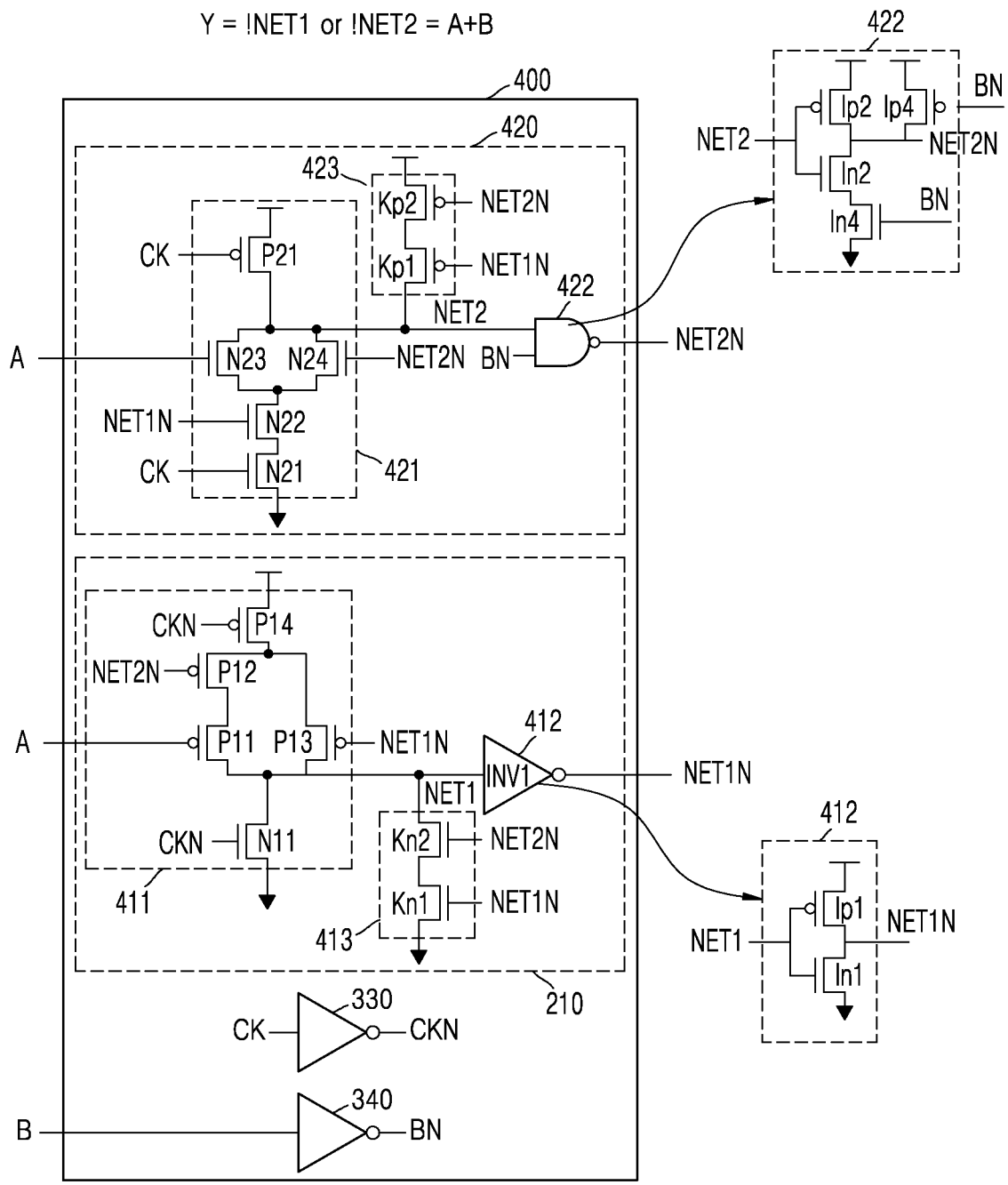
FIG. 9 is a circuit diagram illustrating a transistor-level logic embedded dynamic sequential circuit according to an example embodiment of the present disclosure.

FIG. 9 is a circuit diagram illustrating a transistor-level logic embedded dynamic sequential circuit 400 according to an example embodiment of the present disclosure. FIG. 10 is a timing diagram illustrating an operation of the logic embedded dynamic sequential circuit 400 according to an example embodiment of the present disclosure. FIG. 9 is a circuit diagram illustrating the logic embedded dynamic sequential circuit 400 of FIG. 8 at the transistor level, and FIG. 10 is a timing diagram illustrating the operation of the logic embedded dynamic sequential circuit 400 of FIG. 8.

Referring to FIG. 9, the logic embedded dynamic sequential circuit 400 includes the second operation unit 421 and the second inverting circuit 422. Unlike the second operation unit 221 of FIG. 3, when the logic level of the clock signal CK is the logic high level, the second operation unit 421 of FIG. 9 may perform an OR operation on the logic level of the input signal A and the logic level of the second node NET2N to determine the logic level of the second output node NET2 based on a result of performing a NAND operation on the logic level of the first node NET1N and a result of performing the OR operation. The logic level of the signal Y may be the same as the logic level obtained by inverting the logic level of the first output node NET1 or the second output node NET2.

Unlike the second inverting circuit 222 of FIG. 3, the second inverting circuit 422 of FIG. 9 may include an N-type transistor In4 connected to the N-type transistor In2 in series and receiving the inverted input signal BN at a gate terminal thereof. In addition, the second inverting circuit 422 of FIG. 9 may include a P-type transistor Ip4 connected to the P-type transistor Ip2 in parallel and receiving the inverted input signal BN at a gate terminal thereof. As a result, the second inverting circuit 422 of FIG. 9 may determine the logic level of the second node NET2N by performing a NAND operation on the logic level of the second output node NET2 and the logic level of the inverted input signal BN.

Figure 10:
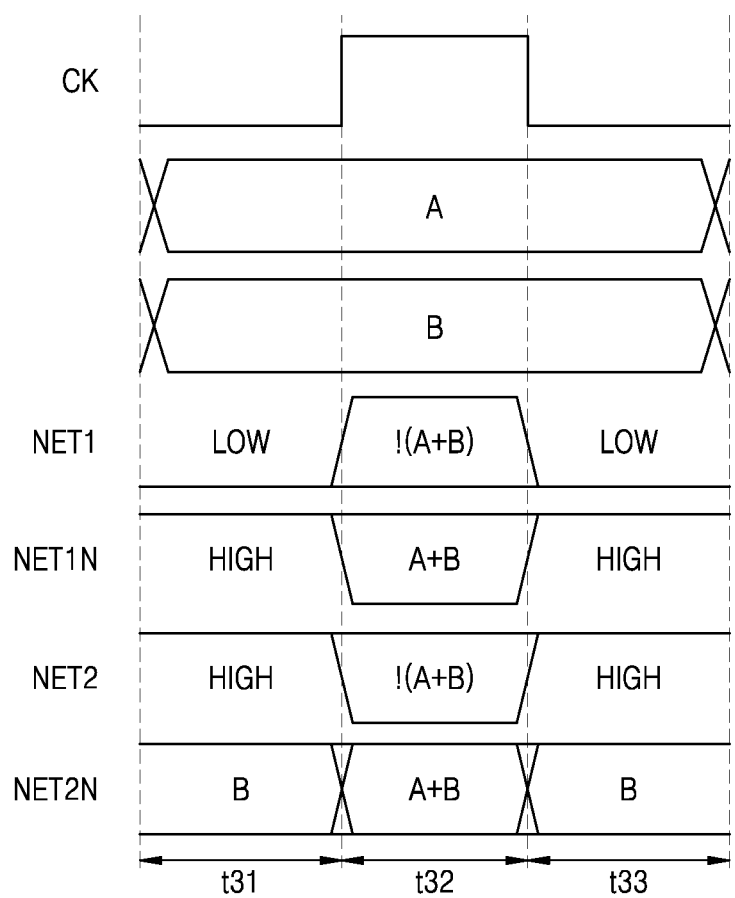
FIG. 10 is a timing diagram illustrating an operation of a logic embedded dynamic sequential circuit according to an example embodiment of the present disclosure.

Referring to FIG. 10, when the clock signal CK has the logic low level, that is, when the inverted clock signal CKN has the logic high level, in a first time period t31 or a third time period t33, the logic level of the first output node NET1 may be maintained at a logic low level by the N-type transistor N11. When the logic level of the first output node NET1 is the logic low level, the logic level of the first node NET1N may become the logic high level by the first inverting circuit 412.

When the clock signal CK has the logic low level in the first time period t31 or the third time period t33, the second output node NET2 may be maintained at the logic high level by the P-type transistor P21. The second inverting circuit 422 may determine the logic level of the second node NET2N by performing a NAND operation on the logic level of the second output node NET2 and the inverted input signal BN. In an embodiment, when the logic level of the second output node NET2 is the logic high level, the logic level of the second node NET2N may be the same as the logic level of the input signal B according to the NAND operation performed on the logic level of the second output node NET2 and the inverted input signal BN.

When the clock signal CK has the logic high level, that is, when the inverted clock signal CKN has the logic low level, in a second time period t32, the second operation unit 421 may determine the logic level of the second output node NET2 as !(A+B) based on an OR operation performed on the logic level of the input signal A and the logic level of the second output node NET2 (i.e., the logic level of the input signal B). Because the second operation unit 421 performs the OR operation using only the N-type transistors N21 to N24, a size of the IC may be reduced. The second inverting circuit 422 may determine the logic level of the second node NET2N, as A+B, based on the NAND operation performed on the logic level of the second output node NET2 and the logic level of the inverted input signal BN. Similarly to the second operation unit 421, the first operation unit 411 may determine the logic level of the first output node NET1, as !(A+B), based on the OR operation performed on the logic level of the input signal A and the logic level of the second node NET2N (i.e., the logic level of the input signal B). Because the first operation unit 411 performs the OR operation using only the P-type transistors P11 to P14, a size of the IC may be reduced.

The logic embedded dynamic sequential circuit 400 may include a discharge circuit 413 and a precharge circuit 423.

Referring to FIG. 10, when both the logic level of the first node NET1N and the logic level of the second node NET2N are the logic high levels (e.g., when the input signal B has the logic high level in the first time period t31), the logic level of the first output node NET1 may be the logic low level. When the logic level of the first node NET1N and the logic level of the second node NET2N are the logic high levels, the discharge circuit 413 may discharge the first output node NET1 to maintain the first output node NET1 at the logic low level. Accordingly, because a stable logic level may be maintained in the nodes through the discharge circuit 413, reliability of the IC including the logic-embedded dynamic sequential circuit 400 may be improved.

Referring to FIG. 10, when both the logic level of the first node NET1N and the logic level of the second node NET2N are the logic low levels (e.g., when A+B has the logic low level in the second time period t32), the logic level of the second output node NET2 may be the logic high level. When both the logic level of the first node NET1N and the logic level of the second node NET2N are the logic low levels, the precharge circuit 423 may precharge the second output node NET2 to maintain the second output node NET2 at the logic high level. Accordingly, because a stable logic level may be maintained in the nodes through the precharge circuit 423, reliability of the IC including the logic embedded dynamic sequential circuit 400 may be improved.

The logic embedded dynamic sequential circuit 400 according to an example embodiment of the present disclosure may maintain the first node NET1N at the logic high level when the clock signal CK has the logic low level through the first inverting circuit 412. As a result, the logic embedded dynamic sequential circuit 400 may determine the logic level of the output signal based on the OR operation performed on the input signal A and the input signal B when the clock signal CK has the logic high level. Thus, the logical operation and the latching operation may be performed within one cycle, and the operation rate of the IC may be improved.

Figure 11:
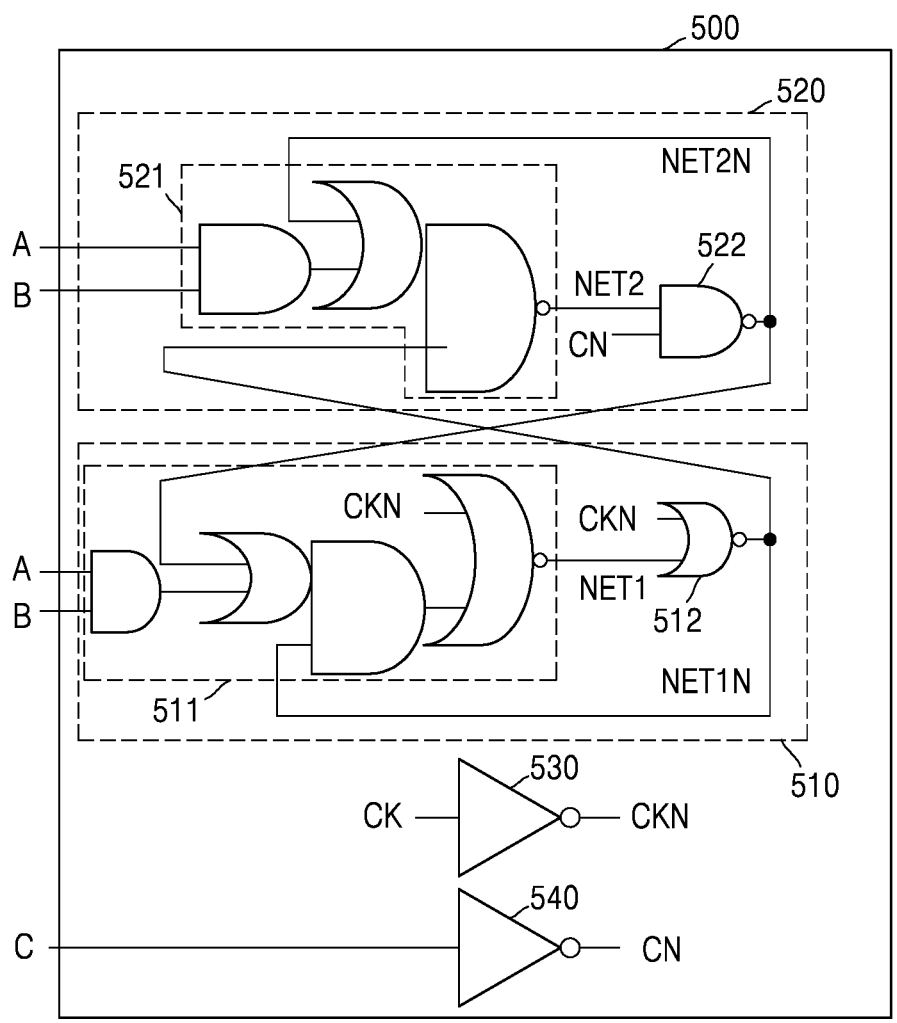
FIG. 11 is a circuit diagram illustrating a gate-level logic embedded dynamic sequential circuit according to an example embodiment of the present disclosure.

FIG. 11 is a circuit diagram illustrating a gate-level logic embedded dynamic sequential circuit 500 according to an example embodiment of the present disclosure. FIG. 11 is a circuit diagram illustrating the logic embedded dynamic sequential circuit 500, at a gate level, receiving a plurality of input signals A, B, and C, performing an AND operation on the input signal A and the input signal B, and outputting A·B+C, which is a result of performing an OR operation on a result of performing the AND operation and the input signal C, as the signal Y. The logic embedded dynamic sequential circuit 500 includes a first circuit 510, a second circuit 520, a clock inverter 530, and an inverter 540. Referring to FIG. 11, although not shown, the logic embedded dynamic sequential circuit 500 may further include an output inverter (not shown) connected to the first output node NET1 or the second output node NET2. The output inverter may generate the signal Y by inverting the logic level of the first output node NET1 or the second output node NET2.

The first circuit 510 may include a first operation unit 511 and a first inverting circuit 512. The first operation unit 511 may determine the logic level of the first output node NET1 based on the logic level of the input signal A, the logic level of the input signal B, the logic level of the inverted clock signal CKN, the logic level of the first node NET1N, and the logic level of the second node NET2N. In an embodiment, the first operation unit 511 may include an AND gate performing a first AND operation on the logic level of the input signal A and the logic level of the input signal B, an OR gate performing an OR operation on a result of performing the first AND operation and the logic level of the second node NET2N, an AND gate performing a second AND operation on a result of performing the OR operation and the logic level of the first node NET1N, and a NOR gate performing a NOR operation on a result of performing the second AND operation and the logic level of the inverted clock signal CKN. Compared with FIG. 8, the first operation unit 511 of FIG. 11 may have a structure in which the AND gate performing the first AND operation on the input signal A and the input signal B to a path through which the input signal A is input to the first operation unit 411 of FIG. 8. The first inverting circuit 512 may determine the logic level of the first node NET1N based on the logic level of the first output node NET1 and the logic level of the inverted clock signal CKN. In an embodiment, the first inverting circuit 512 may be a NOR gate performing a NOR operation on the logic level of the first output node NET1 and the logic level of the inverted clock signal CKN.

The second circuit 520 may include a second operation unit 521 and a second inverting circuit 522. The second operation unit 521 may determine the logic level of the second output node NET2 based on the logic level of the input signal A, the logic level of the input signal B, the logic level of the first node NET1N, and the logic level of the second node NET2N. In an embodiment, the second operation unit 521 may include an AND gate performing an AND operation on the logic level of the input signal A and the logic level of the input signal B, an OR gate performing an OR operation on a result of performing the AND operation and the logic level of the second node NET2N, and a NAND gate performing a NAND operation on a result of performing the OR operation and the logic level of the first node NET1N. The second inverting circuit 522 may determine the logic level of the second node NET2N based on the logic level of the second output node NET2 and the logic level of the input signal C. In an embodiment, the second inverting circuit 522 may be a NAND gate performing a NAND operation on the logic level of the second output node NET2 and the logic level of the input signal C. As will be described later with reference to FIGS. 12 and 13, when the clock signal CK has the logic low level, the logic level of the first node NET1N may be the logic low level, the logic level of the second node NET2N may be the same as the logic level of the input signal C, the logic level of the first output node NET1 may be the logic low level, and the logic level of the second output node NET2 may be the logic high level. When the logic level of the clock signal CK is the logic high level, the logic levels of the first node NET1N and the second node NET2N may be determined by the $A \cdot B + C$ operation, and the logic levels of the first output node NET1 and the second output node NET2 may be determined by a $!(A \cdot B + C)$ operation. Compared with FIG. 8, the second operation unit 521 of FIG. 11 may have structure in which an AND gate performing an AND operation on the input signal A and the input signal B is added to a path through which the input signal A is input to the second operation unit 421 of FIG. 8.

In the logic embedded dynamic sequential circuit 500 according to an example embodiment of the present disclosure, the second circuit 520 may not receive the clock signal CK. Accordingly, as described above with reference to FIGS. 3, 6, and 9, the N-type transistor N21 may not be included, and thus, the number of N-type transistors connected in series may be reduced. Because the rate at which the second output node NET2 is discharged may be increased due to the reduction in the number of N-type transistors connected in series, performance of the IC including the logic-embedded dynamic sequential circuit 500 may be improved.

Figure 12:
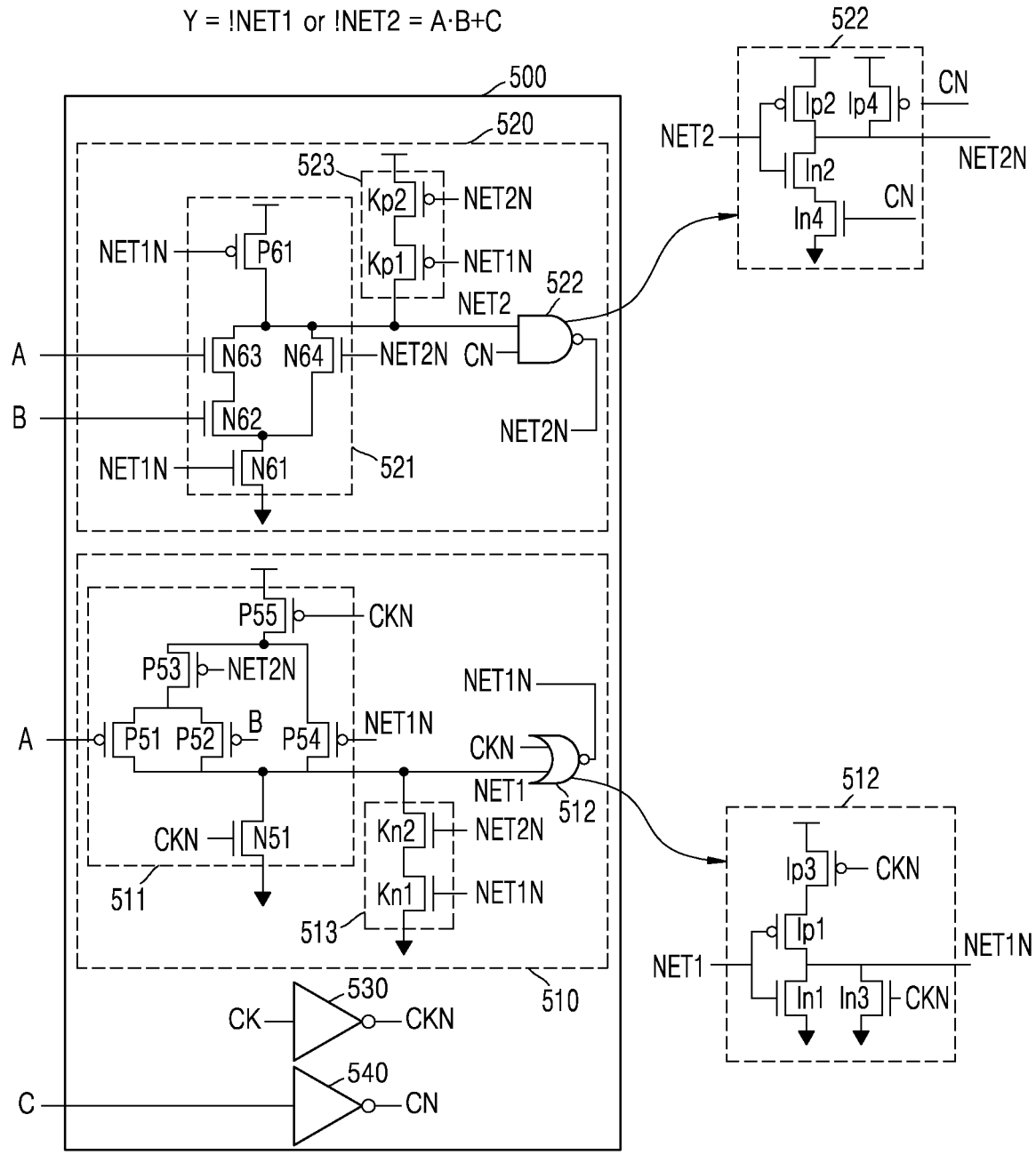
FIG. 12 is a circuit diagram illustrating a transistor-level logic embedded dynamic sequential circuit according to an example embodiment of the present disclosure.
Figure 13:
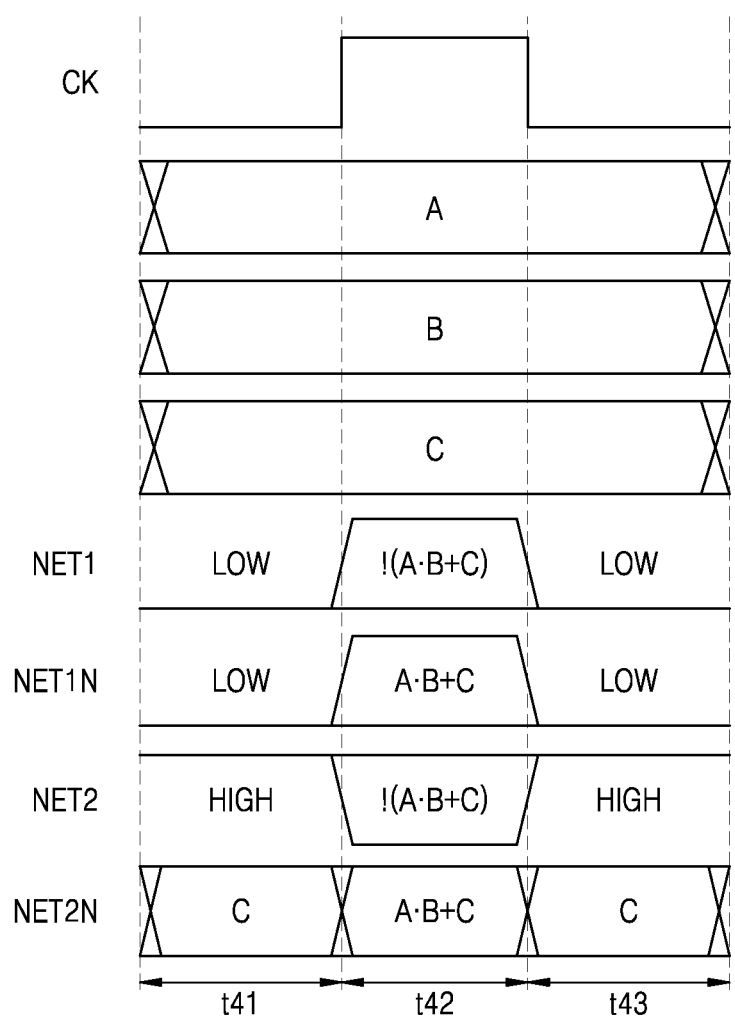
FIG. 13 is a timing diagram illustrating an operation of a logic embedded dynamic sequential circuit according to an example embodiment of the present disclosure.

FIG. 12 is a circuit diagram illustrating a transistor-level logic embedded dynamic sequential circuit 500 according to an example embodiment of the present disclosure. FIG. 13 is a timing diagram illustrating an operation of a logic embedded dynamic sequential circuit according to an example embodiment of the present disclosure. FIG. 12 is a circuit diagram illustrating the logic embedded dynamic sequential circuit 500 of FIG. 11 at a transistor level, and FIG. 13 is a timing diagram illustrating an operation of the logic embedded dynamic sequential circuit 500 of FIG. 11.

Referring to FIG. 12, the logic embedded dynamic sequential circuit 500 includes the first operation unit 511, the first inverting circuit 512, the second operation unit 521, and the second inverting circuit 522.

When the logic level of the inverted clock signal CKN is the logic low level, the first operation unit 511 may perform an AND operation on the logic level of the input signal A and the logic level of the input signal B, perform an OR operation on a result of performing the AND operation and the logic level of the second node NET2N, and determine the logic level of the first output node NET1 based on a result of performing the OR operation and a result of performing the AND operation on the logic level of the first node NET1N. As will be described later with reference to FIG. 13, when the logic level of the clock signal CK is the logic high level, the logic level of the first output node NET1 may be determined as $!(A \cdot B + C)$. Because the first operation unit 511 performs a logical operation using only the P-type transistors P51 to P55, the size of the IC may be reduced. In some embodiments, the first inverting circuit 512 may be implemented in the same way as the first inverting circuit 312 described above with reference to FIG. 6. In the first operation unit 511, when the logic level of the clock signal CK is the logic low level, the logic level of the first node NET1N may be the logic low level.

Compared with the second operation unit 321 of FIG. 6, the second operation unit 521 of FIG. 12 sets the logic level of the first node NET1N to the gate terminal instead of the transistors receiving the clock signal CK at the gate terminal. When the logic level of the clock signal CK is the logic high level, the second operation unit 521 may perform an AND operation on the logic level of the input signal A and the logic level of the input signal B, perform an OR operation on a result of performing the AND operation and the logic level of the second node NET2N, and determine the logic level of the second output node NET2 based on a result of performing the OR operation and performing the AND operation on the logic level of the first node NET1N. For example, as will be described later with reference to FIG. 13, when the logic level of the clock signal CK is the logic high level, the logic level of the second output node NET2 may be determined as !(A·B+C). The second inverting circuit 522 may be implemented in the same manner as the second inverting circuit 422 described above with reference to FIG. 9.

In FIG. 12 and FIG. 13, when the clock signal CK has the logic low level, that is, when the inverted clock signal CKN has the logic high level in a first time period t41 or a third time period t43, the first output node NET1 may be maintained at the logic low level by an N-type transistor N51. When the logic level of the first output node NET1 is the logic low level, the first inverting circuit 512 may determine the logic level of the first node NET1N as the logic low level by performing an NOR operation on the logic level of the first output node NET1 and the logic level of the inverted clock signal CKN.

When the clock signal CK has the logic low level in the first time period t41 or the third time period t43, the logic level of the first node NET1N has the logic low level. Thus, the second output node NET2 may be maintained at the logic high level by a P-type transistor P61. When the logic level of the second output node NET2 is the logic high level, the logic level of the second node NET2N may be the same as the logic level of the input signal C by the second inverting circuit 522.

When the clock signal CK transitions to the logic high level, that is, when the inverted clock signal CKN transitions to the logic low level, in a second time period t42, because the logic level of the first node NET1N in the first time period t41 is the logic low level, the logic level of the first node NET1N in the second time period t42 may be determined as the logic high level by the first inverting circuit 512. When the logic level of the first node NET1N is the logic high level, the P-type transistor P54 is temporarily turned off. Thus, the first operation unit 511 may perform a NAND operation on the logic level of the input signal A and the logic level of the input signal B, and determine the logic level of the first output node NET1 based on an OR operation performed on a result of the NAND operation and the logic level of the second node NET2N (i.e., the logic level of the input signal C). For example, the logic level of the first output node NET1 may be determined by a !(A·B+C) operation. Because the first operation unit 511 performs the logical operation using only the P-type transistors P51 to P53, a size of the IC may be reduced. The first inverting circuit 512 may determine the logic level of the first node NET1N based on a NOR operation performed on the logic level of the first output node NET1 and the logic level of the inverted clock signal CKN. For example, the logic level of the first node NET1N may be determined by an A·B+C operation. Similarly to the first operation unit 511, the second operation unit 521 may perform an AND operation on the logic level of the input signal A and the logic level of the input signal B to determine the logic level of the second output node NET2 based on an OR operation performed on a result of the AND operation and the logic level of the second node NET2N (i.e., the logic level of the input signal C). For example, the logic level of the second output node NET2 may be determined by a !(A·B+C) operation. Because the second operation unit 521 performs the logical operation using only the N-type transistors N62 to N64, a size of the IC may be reduced.

Figure 14:
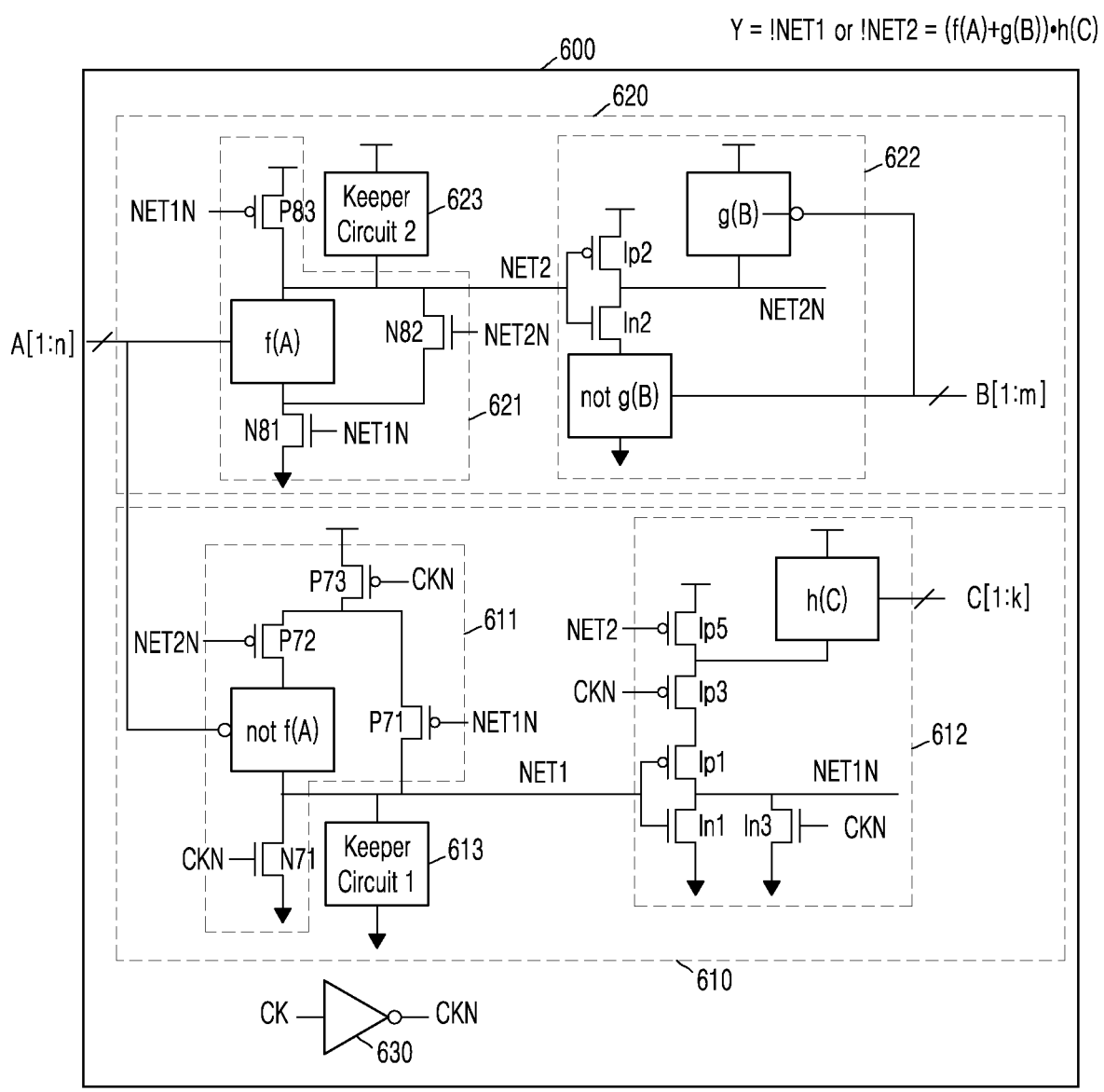
FIG. 14 is a circuit diagram illustrating a transistor-level logic embedded dynamic sequential circuit according to an example embodiment of the present disclosure.
Figure 15:
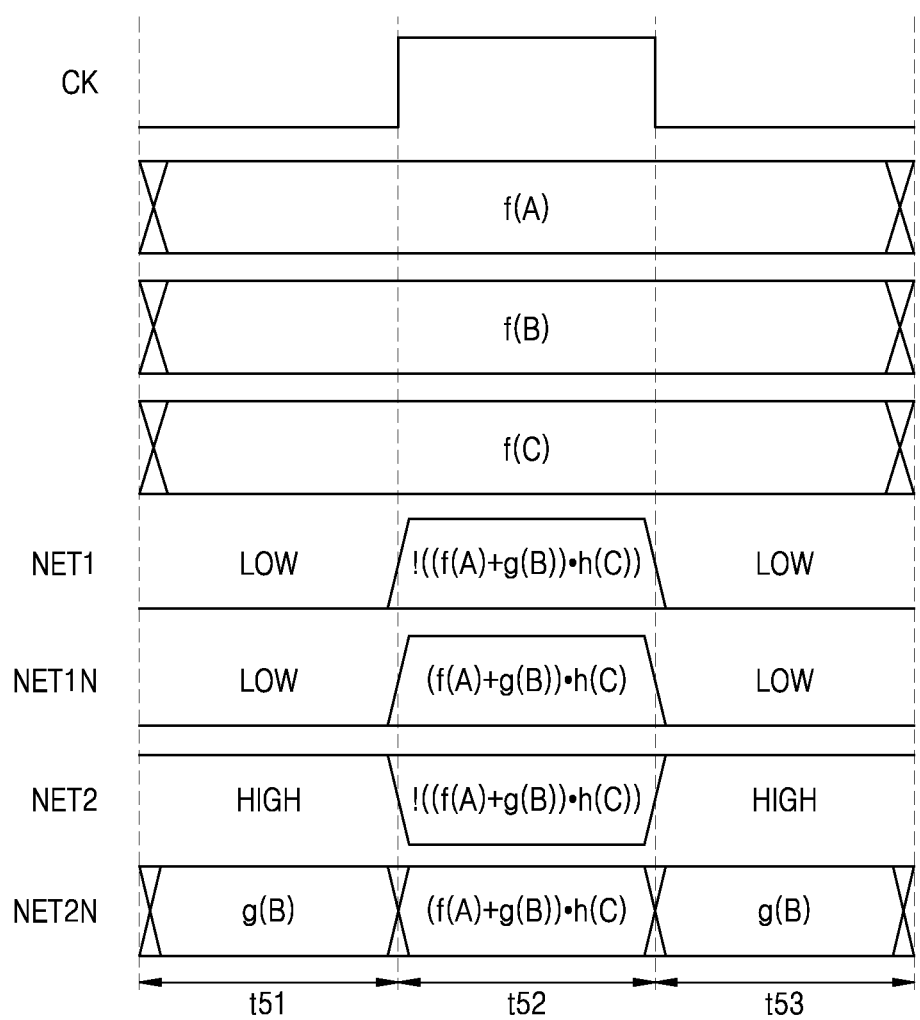
FIG. 15 is a timing diagram illustrating an operation of a logic embedded dynamic sequential circuit according to an example embodiment of the present disclosure.

FIG. 14 is a circuit diagram illustrating a transistor-level logic embedded dynamic sequential circuit 600 according to an example embodiment of the present disclosure. FIG. 15 is a timing diagram illustrating an operation of the logic embedded dynamic sequential circuit 600 according to an example embodiment of the present disclosure. FIG. 14 is a circuit diagram illustrating the logic embedded dynamic sequential circuit 600, at a transistor level, performing a first logical operation f(A) on a first input signal set A[1:n], performing a second logical operation g(B) on a second input signal set B[1:m], and performing a third logical operation h(C) on a third input signal set C[1:k], and outputting (f(A)+g(B))·h(C), as the signal Y, according to the clock signal CK (n, m, and k are natural numbers). FIG. 15 is a timing diagram illustrating an operation of the logic embedded dynamic sequential circuit 600 of FIG. 14. Although not shown, the logic level of the signal Y may be determined based on the logic level of the first output node NET1 or the second output node NET2. In an embodiment, the logic level of the signal Y may be a logic level obtained by inverting the logic level of the first output node NET1 or the second output node NET2.

The logic embedded dynamic sequential circuit 600 of FIG. 14 may be understood as an embodiment obtained by abstracting the logic embedded dynamic sequential circuit 500 of FIG. 12 using the first logical operation f(A), the second logical operation g(B), and the third logical operation h(C). The first to third logical operations f(A), g(B), and h(C) may be implemented as a complex logic gate receiving the input signal sets A[1:n], B[1:m], and C[1:k]).

In some embodiments, f(A) may correspond to a complex logic gate performing an (A1·A2)+A3 logical operation on A[1:3], g(b) may correspond to a complex logic gate performing a !((B1+B2)·B3 logical operation, and h(C) may correspond to a transistor always turned on in response to a logical 1 or correspond to a complex logic gate performing a !((C1+C2)·C3) logical operation.

The logic embedded dynamic sequential circuit 600 may include a first circuit 610, a second circuit 620, and a clock inverter 630. The first circuit 610 may include a first operation unit 611 and a first inverting circuit 612. The second circuit 620 may include a second operation unit 621 and a second inverting circuit 622.

Referring to FIGS. 14 and 15, when the logic level of the clock signal CK is the logic low level, that is, when the logic level of the inverted clock signal CKN is the logic high level, in a first time period t51 or a third time period t53, the logic level of the first output node NET1 may be determined as the logic low level by an N-type transistor N71. The logic level of the first node NET1N may be determined as the logic low level by an N-type transistor In3. When the logic level of the first node NET1N is the logic low level, the logic level of the second output node NET2 may be determined as the logic high level by a P-type transistor P83. The logic level of the second node NET2N may be determined as the second inverting circuit 622 performs the second logical operation g(B).

When the clock signal CK has the logic high level, that is, when the logic level of the inverted clock signal CKN is the logic low level, in a second time period t52, the logic level of the first output node NET1 may be determined based on a !((f(A)+g(B))·h(C)) operation by the first operation unit 611. The logic level of the first node NET1N may be determined by the first inverting circuit 612 based on the (f(A)+g(B))·h(C) operation. Also, the logic level of the second output node NET2 may be determined by the second operation unit 621 based on the !((f(A)+g(B))·h(C)) operation. The logic level of the second node NET2N may be determined by the second inverting circuit 622 based on the (f(A)+g(B))·h(C) operation.

In the logic embedded dynamic sequential circuit 600 according to an example embodiment of the present disclosure, even the inverting circuits 612 and 622, as well as the first and second operation units 611 and 621, perform part of the logical operation function, and thus, complicated logical operations may be performed in parallel in a plurality of structures. Therefore, performance of the IC may be improved.

Figure 16:
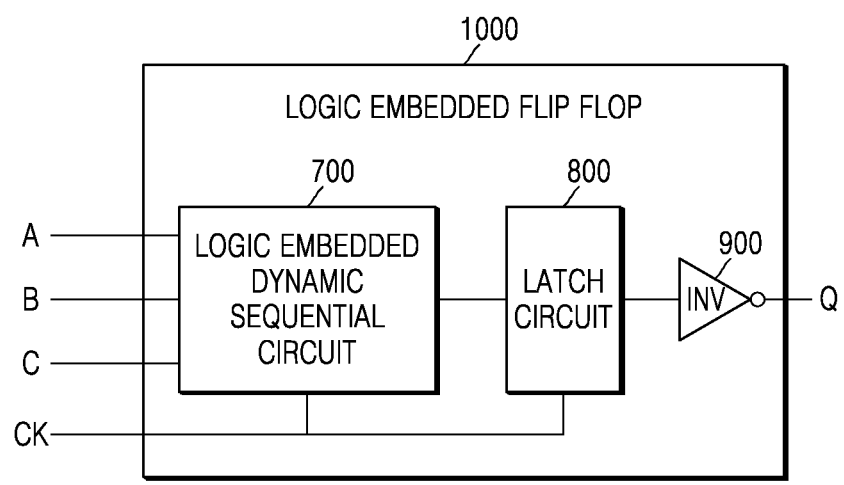
FIG. 16 is a diagram illustrating a logic embedded flip-flop according to an example embodiment of the present disclosure.

FIG. 16 is a diagram illustrating a logic embedded flip-flop 1000 according to an example embodiment of the present disclosure. Referring to FIG. 16, the logic embedded flip-flop 1000 may include a logic embedded dynamic sequential circuit 700, a latch circuit 800, and an inverter 900. The logic embedded dynamic sequential circuit 700 may be implemented as an IC.

The logic embedded dynamic sequential circuit 700 may be an example of the logic embedded dynamic sequential circuits described above with reference to FIGS. 1 and 5 to 15. The latch circuit 800 may be an example of the latch circuits described above with reference to FIGS. 1 to 3. In some embodiments, the latch circuit 800 may be a logic embedded dynamic sequential circuit.

Referring to FIGS. 1 to 15, the logic embedded dynamic sequential circuit performs a level trigger operation in which a result of a logical operation performed on input signals is output when the logic level of the clock signal CK is the logic high level, but the flip-flop 1000 may perform an edge trigger operation. That is, in the logic embedded flip-flop 1000, the result of the logical operation performed on the input signals A, B, and C at a rising edge or a falling edge of the clock signal CK may be output as a signal Q.

The logic embedded flip-flop 1000 may perform both the logical operation and the latching operation on the input signals A, B, and C, and thus, performance of an IC including the logic embedded flip-flop 1000 may be improved.

While the inventive concept has been particularly shown and described with reference to embodiments thereof, it will be understood that various changes in form and details may be made therein without departing from the spirit and scope of the following claims.

What is claimed is:

1. An integrated circuit configured to perform a logical operation on a plurality of input signals including a first input signal and a second input signal to generate an output signal, the integrated circuit comprising:
    a first circuit configured to receive a logic level of the first input signal, an inverted logic level of a clock signal, a logic level of a first node and a logic level of a second node, to determine a logic level of a first output node;
    a second circuit configured to receive the logic level of the first input signal, a logic level of the clock signal, the logic level of the first node and the logic level of the second node, to determine a logic level of a second output node; and
    an inverter configured to receive only the second input signal to invert the second input signal and output the inverted second input signal,
    wherein one of the first circuit and the second circuit receives the inverted second input signal,
    wherein the output signal is determined based on the logic level of the first output node or the logic level of the second output node.

2. The integrated circuit of claim 1, wherein the first circuit includes a first inverting circuit configured to generate the logic level of the first node by inverting the logic level of the first output node in a time period in which the logic level of the clock signal is a first logic level, and the second circuit includes a second inverting circuit configured to generate the logic level of the second node by inverting the logic level of the second output node in the time period in which the logic level of the clock signal is the first logic level.

3. The integrated circuit of claim 2, wherein the first inverting circuit is configured to determine the logic level of the first node by perform a NOR operation on the inverted logic level of the logic level of the second input signal and the logic level of the first output node.

4. The integrated circuit of claim 3, wherein the first inverting circuit comprises:
    a first N-type transistor including a gate terminal connected to the first output node and a drain terminal connected to the first node;
    a second N-type transistor including a gate terminal configured to receive the inverted logic level of the logic level of the second input signal and a drain terminal connected to the first node;
    a first P-type transistor including a gate terminal connected to the first output node; and
    a second P-type transistor including a gate terminal configured to receive the inverted logic level of the logic level of the second input signal,
    wherein the first P-type transistor is connected to the second P-type transistor in series to form a first serial structure, and one end of the first serial structure is connected to the first node.

5. The integrated circuit of claim 2, wherein the first circuit further comprises a logic circuit configured to perform an AND operation on the logic level of the first input signal and the logic level of the first node and to perform a NOR operation on a result of performing the AND operation, the inverted logic level of the logic level of the clock signal and the logic level of the second node to generate the logic level of the first output node.

6. The integrated circuit of claim 2, wherein the second circuit further comprises a logic circuit configured to perform an AND operation on the logic level of the first input signal and the logic level of the first node, to perform an OR operation on a result of performing the AND operation and the logic level of the second node, and to perform a NAND operation on a result of performing the OR operation and the logic level of the clock signal to generate the logic level of the second output node.

7. The integrated circuit of claim 2, wherein the second inverting circuit is configured to generate the logic level of the second node by performing a NAND operation based on the inverted logic level of the logic level of the second input signal and the logic level of the second output node.

8. The integrated circuit of claim 7, wherein the second inverting circuit comprises:
    a first N-type transistor including a gate terminal connected to the second output node and a drain terminal connected to the second node;
    a second N-type transistor including a gate terminal configured to receive the inverted logic level of the logic level of the second input signal; a first P-type transistor including a gate terminal connected to the second output node and a drain terminal connected to the second node; and
    a second P-type transistor including a gate terminal configured to receive the inverted logic level of the logic level of the second input signal and a drain terminal connected to the second node,
    wherein the first N-type transistor is connected to the second N-type transistor in series to form a second serial structure, and one end of the second serial structure is connected to the second node.

9. The integrated circuit of claim 8, wherein the first circuit further comprises:
a logic circuit configured to perform an OR operation on the logic level of the first input signal and the logic level of the second node, to perform an AND operation on a result of performing the OR operation and the logic level of the first node, and to perform a NOR operation on a result of performing the AND operation and the inverted logic level of the logic level of the clock signal to generate the logic level of the first output node.

10. The integrated circuit of claim 8, wherein the second circuit further comprises:
a logic circuit configured to perform an OR operation on the logic level of the first input signal and the logic level of the second node, to perform a NAND operation on a result of performing the OR operation, the logic level of the clock signal, and the logic level of the first node, and to perform a NAND operation based on a result of performing the NAND operation and the inverted logic level of the logic level of the second input signal to generate the logic level of the second output node.

11. The integrated circuit of claim 2, further comprising:
a discharge circuit configured to discharge the first output node when the logic level of the first node and the logic level of the second node are logic high levels; and
a precharge circuit configured to precharge the second output node when the logic level of the first node and the logic level of the second node are logic low levels.

12. A logic embedded dynamic sequential circuit configured to perform a logical operation, the logic embedded dynamic sequential circuit comprising:
a first logic circuit configured to determine a logic level of a first output node based on a result of performing a first logical operation on first input signals;
a second logic circuit configured to determine a logic level of a second output node based on the result of performing the first logical operation on the first input signals;
a first inverting circuit configured to determine a logic level of a first node based on a result of performing a third logical operation on third input signals; and
a second inverting circuit configured to determine a logic level of a second node based on performing a second logical operation on second input signals,
wherein the logic level of the first output node or the second output node is determined by performing an OR operation on the result of performing the first logical operation and the result of performing the second logical operation to generate a first result, and performing an AND operation on the first result and the result of performing the third logical operation, and the output signal is determined based on the logic level of the first output node or the second output node.

13. The logic embedded dynamic sequential circuit of claim 12, wherein the first logic circuit comprises P-type transistors configured to determine the logic level of the first output node by performing an OR operation on the result of performing the first logical operation and the logic level of the second node to generate a first result, and performing an AND operation on the first result and the logic level of the first node.

14. The logic embedded dynamic sequential circuit of claim 12, wherein the second logic circuit comprises N-type transistors configured to determine the logic level of the second output node by performing an OR operation on the result of performing the first logical operation and the logic level of the second node to generate a first result, and performing an AND operation on the first result and the logic level of the first node.

15. The logic embedded dynamic sequential circuit of claim 12, further comprising:
a discharge circuit configured to discharge the first output node when the logic level of the first node and the logic level of the second node are logic high levels; and
a precharge circuit configured to precharge the second output node when the logic level of the first node and the logic level of the second node are logic low levels.

16. An integrated circuit configured to perform a logical operation, the integrated circuit comprising:
a first circuit configured to determine a logic level of a first output node based on a first input signal, a second input signal, an inverted clock signal, a logic level of a first node, and a logic level of a second node;
a second circuit configured to determine the logic level of a second output node based on the first input signal, the second input signal, the logic level of the first node, the logic level of the second node, and an inverted logic level of a logic level of a third input signal; and
an inverter configured to receive only the third input signal to invert the logic level of the third input signal to generate the inverted logic level.

17. The integrated circuit of claim 16, wherein the first circuit includes a logic circuit configured to perform an AND operation on the logic level of the first input signal and the logic level of the second input signal, and to determine the logic level of the first output node based on a result of performing an OR operation on a result of performing the AND operation and the logic level of the second node.

18. The integrated circuit of claim 17, wherein the first circuit further comprises an inverting circuit configured to generate the logic level of the first node by performing a NOR operation on the logic level of the first output node and the inverted clock signal.

19. The integrated circuit of claim 16, wherein the second circuit further comprises:
a logic circuit configured to perform an AND operation on the logic level of the first input signal and the logic level of the second input signal and to determine the logic level of the second output node based on a result of performing an OR operation on a result of performing the AND operation and the logic level of the second node.

20. The integrated circuit of claim 19, wherein the logic circuit comprises an inverting circuit configured to generate the logic level of the second node by performing a NAND operation on the logic level of the second output node and the logic level of the third input signal.

* * * * *